United States Patent

Nitschke et al.

Patent Number: 5,734,318
Date of Patent: Mar. 31, 1998

[54] ELECTRONIC DEVICE

[75] Inventors: Werner Nitschke, Rosseger Weg; Hermann Maier, Markgroeningen; Werner Weber, Vaihingen, all of Germany

[73] Assignee: Robert Bosch GmbH, Stuttgart, Germany

[21] Appl. No.: 681,732

[22] Filed: Jul. 29, 1996

[30] Foreign Application Priority Data

Jul. 27, 1995 [DE] Germany ............ 195 27 420.2

[51] Int. Cl.$^6$ ............................................. B60R 21/32
[52] U.S. Cl. .................. 340/438; 340/436; 180/282; 180/735; 307/10.1
[58] Field of Search ....................... 340/436, 438; 180/282; 280/735; 307/10.1

[56] References Cited

U.S. PATENT DOCUMENTS

| | | | |
|---|---|---|---|
| 4,222,030 | 9/1980 | Yasui et al. | 280/735 |
| 4,278,971 | 7/1981 | Yasui et al. | 340/661 |
| 4,608,501 | 8/1986 | Andres et al. | 180/282 |
| 4,673,912 | 6/1987 | Kumasaka et al. | 340/438 |
| 4,945,336 | 7/1990 | Itoh et al. | 340/438 |
| 4,973,912 | 11/1990 | Kaminski et al. | 324/652 |
| 5,045,835 | 9/1991 | Masagi et al. | 340/438 |
| 5,107,245 | 4/1992 | Gesper et al. | 340/436 |
| 5,181,011 | 1/1993 | Okano | 340/438 |
| 5,424,584 | 6/1995 | Matsuda et al. | 340/438 |
| 5,515,027 | 5/1996 | Billig et al. | 340/438 |

FOREIGN PATENT DOCUMENTS

| | | | |
|---|---|---|---|
| 0 577 988 | 6/1993 | European Pat. Off. | |
| 0577988 | 11/1994 | European Pat. Off. | B60R 21/32 |

OTHER PUBLICATIONS

W. Suchowerskyj, Article 1141, Ingenieurs de l'Automobile (1982) No. 6, Évolution en matière de détecteurs de choc, pp. 69–77.

Primary Examiner—Jeffery Hofsass
Assistant Examiner—Daniel J. Wu
Attorney, Agent, or Firm—Kenyon & Kenyon

[57] ABSTRACT

An electronic device includes an acceleration-sensitive sensor, an electronic circuit arrangement for analyzing the output signal from the sensor, an ignition output element, an ignition element, and a safety device for the vehicle's occupants. To test the operating readiness of the ignition element, an oscillator circuit is also provided, which applies an output signal to the ignition element. The resulting voltage drop obtained across the ignition element is compared by means of a window comparator to threshold values.

6 Claims, 1 Drawing Sheet

ELECTRONIC DEVICE

BACKGROUND INFORMATION

An electronic device is known, for example, from the article 1141, Ingenieurs de l'Automobile (1982) No. 6, pp. 69–77. Such devices must be in a state of constant operating readiness in order to protect the lives of the vehicle's occupants in the event of a serious accident. This constant operating readiness must be constantly monitored using appropriate test procedures, involving as many components of the safety system as possible. Electronic devices of this type normally include at least one acceleration-sensitive sensor, an electronic analyzer circuit for the output signals of the acceleration-sensitive sensor, an ignition element to activate a safety device such as an airbag and/or belt tightener or the like, as well as an output element for activating the ignition element. The ignition element normally consists of a type of resistor wire, which can be heated by electric current, and which, when heated, activates a chemical substance that releases a large amount of gas.

Today's electronic circuits are highly reliable. This makes it even more important that this ignition element which, as a critical component, produces the effective connection between the electronic circuit and the actual safety device such as an airbag or a belt tightener, be constantly tested. It is known that the functionality of an ignition element can be tested by passing a very small test current through it and by measuring the voltage drop thus obtained across the ignition element. Thus, it can be established whether or not the ignition element still has the predefined set resistance.

More recently, the applicant has developed new types of electronic devices operating on the principle of alternating current ignition, where the ignition element is not activated with a one-time large electric charge required for ignition by passing a suitably strong current through the ignition element. Rather, the ignition element is activated, as if in cycles, with a large number of successive current pulses, until the amount of energy required for activation has been supplied. This procedure has the advantage, among others, that an activation (ignition) process once started can be interrupted, for example, if it is detected after some time that the air bag system does not need to be triggered, since only a minor accident has taken place. For this purpose, a special ignition element, consisting of the actual ignition primer connected in series with a small capacitor, was developed. In this context, "small" means a capacitor with a relatively small capacitance. The capacitance of this capacitor is so small that it can only store an amount of charge that is per se insufficient to activate the actual ignition primer, i.e., to heat it to the point where it can trigger an air bag system. Only repeated charging and discharging of this capacitor results in a current sufficiently high to activate the ignition primer.

SUMMARY OF THE INVENTION

The present invention provides for an especially effective monitoring of the electronic device and can thus provide a high degree of operating readiness. In particular, the present invention allows for the monitoring of the resistor of the ignition primer, monitoring of the capacitor combined with the ignition primer into an ignition element in the ignition circuit, the detection of leak resistances between the ignition circuit conductors, and the connection of the vehicle's electric system to the ground or positive battery terminal, as well as the detection of leak currents affecting the ignition circuit. The electronic device is characterized by a simple and economical design, well suited for mass production.

BRIEF DESCRIPTION OF THE DRAWINGS

The FIGURE shows a block diagram of an electronic device according to the present invention.

DETAILED DESCRIPTION

Figure 1:
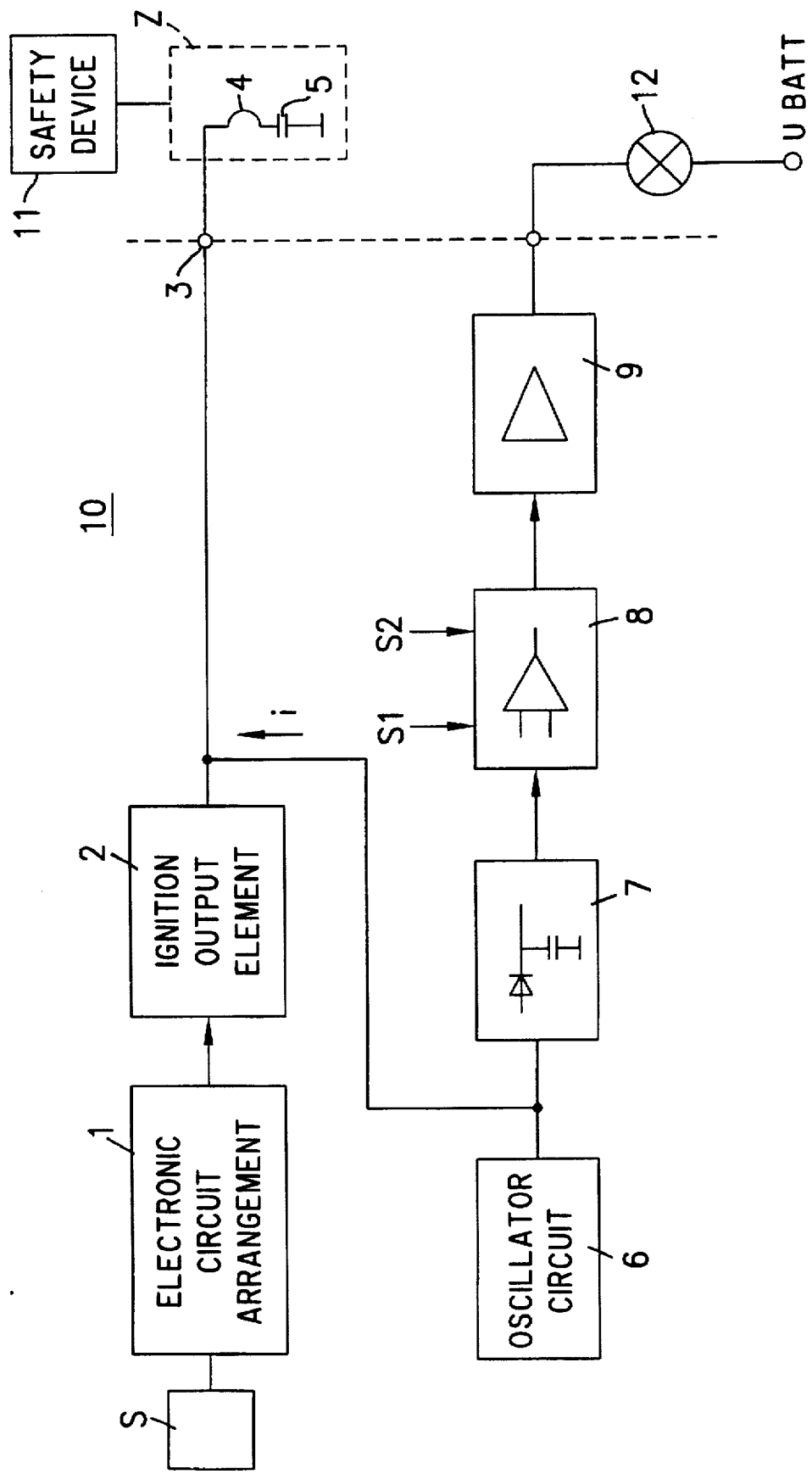

The FIGURE shows the electronic device 10 as a block diagram. It includes at least one acceleration-sensitive sensor S, connected to an electronic circuit arrangement 1 for analyzing the output signal of sensor S. Electronic circuit arrangement 1 may be used to test whether the output signals of sensor S exceed a pre-definable signal threshold, which would indicate an accident representing a danger for the occupants of the vehicle.

Electronic circuit arrangement 1 is furthermore connected to an ignition output element 2, which in turn activates an ignition element 4, 5, connected to output terminal 3. This ignition element 4, 5 is activated when electronic circuit arrangement 1 receives a suitably strong output signal from acceleration-sensitive sensor S. Ignition element 4, 5 includes an ignition primer 4 and a capacitor 5 with a relatively small capacitance, connected in series with this ignition primer. Ignition primer 4 normally includes a resistor wire, which can be heated by an electric current. When heated, ignition primer 4 is capable of activating a chemical substance, which then releases a large amount of gas used to inflate the air bag. Ignition element 4, 5 is thus effectively connected to at least one safety device 11 for the vehicle's occupants, such as an airbag and/or belt tightener or the like. Ignition primer 4 is activated, i.e. heated, when it is traversed by a sufficiently high current imparting to it a sufficiently large amount of energy.

Capacitor 5, connected in series with ignition primer 4, has, however, such a small capacitance that it can only store a relatively small amount of electric charge. This charge is insufficient to activate ignition primer 4. Only repeated recharging of capacitor 5 by cyclic charging and discharging results in a sufficiently strong current through ignition primer 4.

Ignition element Z, which includes ignition primer 4 and capacitor 5, is a critical component for the operation of the electronic device and must therefore be regularly monitored. For this purpose, electronic device 10 also includes an oscillator circuit 6, which emits a preferably sinusoidal or square output signal. The output terminal of oscillator circuit 6 is connected to output terminal 3, which in turn is connected to ignition element Z. The output terminal of oscillator circuit 6 is furthermore connected to a component 7, which rectifies and smooths the output signal of oscillator circuit 6. The output terminal of component 7 is also connected to the input of a window comparator 8, which has two threshold values S1 and S2. The output terminal of window comparator 8 is also connected to the input of an output element 9, the output terminal of which is connected to a first terminal of a signal device 12, the second terminal of which is connected to the battery voltage $U_{batt}$.

Oscillator circuit 6 supplies a current i to ignition element Z connected to output terminal 3. The voltage drop at ignition element Z is rectified and smoothed in component 7. Window comparator 8 compares the smoothed voltage with two threshold values S1 and S2. if the voltage exceeds the higher threshold value S2 or drops below the lower threshold value S1, signal device 12 is activated via output element 9, which is then activated. Signal device 12 can preferably be a warning light that is activated and goes on in the event of a defect in ignition element Z.

Oscillator circuit 6 can be conveniently operated so that it remains permanently on after the vehicle is started and therefore permanently emits an output signal, which results in a relatively small current flowing through ignition element Z. It can be especially desirable for saving energy and extending the life of ignition element Z if oscillator circuit 6 is activated only occasionally to test ignition element Z, for example, whenever the vehicle is started by turning the vehicle's ignition key. In addition, regular testing of ignition element Z at longer time intervals may be desirable during the operation of the vehicle. For this purpose, after a pre-definable rest period, oscillator circuit 6 must emit a suitable output signal indicating that a test current I can be supplied to ignition element Z.

What is claimed is:

1. An electronic device comprising:

at least one acceleration-sensitive sensor;

an electronic circuit arrangement for analyzing an output signal of the sensor;

an ignition output element coupled to the electronic circuit arrangement;

an ignition element including an ignition primer and a capacitor, the ignition primer and the capacitor being connected in series;

at least one safety device for at least one vehicle occupant, the safety device being triggered by the ignition element; and an oscillator circuit, an output terminal of the oscillator circuit being coupled to the ignition element for supplying a test current to the ignition element.

2. The electronic device according to claim 1, wherein the oscillator circuit emits a sinusoidal output signal.

3. The electronic device according to claim 1, wherein the oscillator circuit emits a square output signal.

4. The electronic device according to claim 1, further comprising:

a rectifying and smoothing component coupled to the output terminal of the oscillator circuit, the component rectifying and smoothing an output signal of the oscillator circuit; and a window comparator for receiving an output signal of the rectifying and smoothing component and for comparing the output signal of the component with first and second threshold values.

5. The electronic device according to claim 4, further comprising:

a signal device; and an output element coupled to the window comparator and to the signal device for activating the signal device as a function of the comparisons made by the window comparator.

6. The electronic device according to claim 1, wherein a first capacitance of the capacitor is less than a second capacitance sufficient to activate the ignition element.

* * * * *